United States Patent [19]

Langner et al.

[11] Patent Number: 4,675,528

[45] Date of Patent: Jun. 23, 1987

[54] METHOD FOR MEASUREMENT OF SPOTSIZE AND EDGEWIDTH IN ELECTRON BEAM LITHOGRAPHY

[75] Inventors: Guenther O. Langner, Westford; Kenneth J. Harte, Carlisle; Michael J. Dalterio, Sudbury, all of Mass.; Marvin Fishbein, Jerusalem, Israel

[73] Assignee: Control Data Corporation, Minneapolis, Minn.

[21] Appl. No.: 750,081

[22] Filed: Jun. 28, 1985

[51] Int. Cl.$^4$ .............................................. G01N 27/00
[52] U.S. Cl. .................................. 250/396 R; 250/307; 324/71.3
[58] Field of Search .............. 324/71.3; 250/307, 310, 250/311, 492.3, 491.1, 492.23, 396 R, 397, 398

[56] References Cited

U.S. PATENT DOCUMENTS

| 3,465,244 | 9/1986 | Wahlin | 250/396 |
| 4,086,491 | 4/1978 | Vaughan | 250/397 |
| 4,336,597 | 6/1982 | Okubo et al. | 364/560 |
| 4,514,638 | 4/1985 | Lischke et al. | 250/492.2 |

FOREIGN PATENT DOCUMENTS

| 0021592 | 2/1978 | Japan | 324/71.3 |
| 0083806 | 6/1980 | Japan | 250/397 |

OTHER PUBLICATIONS

Groves et al., "Electron-Beam Broadening Effects Caused by Discreteness of Space Charge," J Vac Sci Tech, 10(6), Nov./Dec. 79.

Primary Examiner—Bruce C. Anderson
Assistant Examiner—Paul A. Guss
Attorney, Agent, or Firm—Charles W. Helzer

[57] ABSTRACT

The technique of measuring the spotsize and edgewidth of an electron beam by incrementally scanning the beam through discrete scan locations across a sharp edge is improved by processing the resulting beam current signals directly rather than the differentiated beam current signal. A linear regression is performed on beam current data points expected to fall in the linear portion of the beam current versus beam position characteristic in order to provide a linear approximation of the overall characteristic. Extrapolation of the linear function to its intersections with the maximum ($I_1$) and minimum ($I_0$) beam current levels yields corresponding beam positions $Z_B$ and $Z_A$, such that ($Z_B-Z_A$) is a measure of spotsize in the scan direction. Edgewidth between the twelve and eighty-eight percent amplitude levels is obtained by locating measured beam currents at incremental scan locations on both sides of beam positions $Z_A$ and $Z_B$, and interpolating to find the actual beam currents $I_A$ and $I_B$ at these positions. Edgewidths $D_A$ and $D_B$ are computed as $D_A=4\sqrt{\pi}(Z_B-Z_A)(I_A-I_0)(I_1-I_0)$ and $D_B=4\sqrt{\pi}(Z_B-Z_A)(I_1-I_B)(I_1-I_0)$. In the case of a square beam with rounded corners, spotsize (i.e., side of square) is measured by a diagonal incremental scan and determination, by interpolation, of the beam positions $Z_C$ and $Z_D$ at which the beam current is $I_C=I_0+19(I_1-I_0)/64$ and $I_D=I_0+45(I_1-I_0)/64$. The spotsize is then computed from the formula 3.01816 ($Z_C-Z_D$).

28 Claims, 5 Drawing Figures

METHOD FOR MEASUREMENT OF SPOTSIZE AND EDGEWIDTH IN ELECTRON BEAM LITHOGRAPHY

TECHNICAL FIELD

The present invention relates to measuring spotsize and edgewidth of electron beams and, more particularly, to improvements in the accuracy of such measurements.

BACKGROUND OF THE INVENTION

Electron beam lithography systems of the high beam throughput type employ beam spots which are shaped either as fixed squares, circles, or some other shape. The dimensions of spots generated by the focused electron beam in the target plane (i.e., on a wafer, mask, reticle, etc.) must meet certain specifications within very close tolerances. The measurement and control of the spotsize are, therefore, very important. Unavoidable optical aberrations and electron-to-electron interaction cause edges of the beam spot to be somewhat less than sharply defined; rather, the beam current density drops off from its maximum value within the spot to zero with a finite slope and within a finite distance. Referring to FIG. 1 of the accompanying drawings, in width of this drop-off distance determines the edgewidth which is sometimes defined as the portion of the beam spot width existing between the beam current density points at ten percent and ninety percent of the maximum beam current density. More often, the twelve percent and eighty-eight percent points are employed in order to correspond to definitions established in connection with Gaussian bell-shaped aberration disks. In either case, the edgewidth determines the electron-optical resolution of the spot.

It is important to measure spotsize and edgewidth accurately and quickly in order to utilize these data to effect corrective action, such as refocusing of the beam, rotationally correcting the spot image of the deflection, adjusting the coefficients for the correction of astigmatism, etc. It is common practice to obtain these data by scanning the beam spot in the target plane across the sharp edge of a member which partially blocks the beam receiving surface of a beam current detector. The member is disposed in the target plane with the sharp edge extending perpendicular to the direction of scan with a length considerably greater than the corresponding beam spot dimension. The resulting beam current detected by the beam current detector is displayed on an oscilloscope. The spot profile in the scan direction is obtained by differentiating the beam current signal as a function of scan displacement. The differentiated signal lends itself to a graphical determination of the spotsize and edgewidth. The differentiated signal, however, has a low signal-to-noise ratio because differentiation inherently includes high-pass filtering.

OBJECTS AND SUMMARY OF THE INVENTION

It is therefore an object of the present invention to provide a method and apparatus which permit the primary scan beam current signal to be utilized in measuring spotsize and edgewidth in a spot formed by an electron beam in a target plane.

It is another object of the present invention to provide a method and apparatus which permits the spotsize and edgewidth of a selectively scanned electron beam to be measured using the beam current signal detected by a beam current detector partially blocked by a sharp-edged member as a function of different beam scan locations without requiring differentiation of the resulting beam current signals.

Another object of the present invention is to provide a method and apparatus for measuring spotsize and edgewidth in a selectively scanned electron beam by processing the beam current signal, as a function of scan location, according to mathematical formulae which provide very close approximations of the parameters to be measured.

In accordance with the present invention, two methods are employed for effecting measurement of spotsize in electron beams. The first method yields the spotsize and edgewidth for rectangular spots and circular spots but cannot accurately measure diagonal dimensions in rectangular spots having rounded corners produced by imperfect image-forming apertures. The second method yields spotsize for symmetrical spots, irrespective of the fact that the corners may be rounded. Both methods include sampling and digitizing of the beam current signal obtained via a scan of the beam spot in a direction perpendicular to the shape edge of a beam intercepting member overlying a portion of the beam current detector.

In accordance with the first method, the beam is scanned in predetermined increments, between discrete scan locations, across the sharp edge of the beam intercepting member. The detected beam current is read and stored for each beam scan location. The base line current $I_0$ is determined by averaging the beam current readings for a first predetermined number of beam scan locations in which no portion of the beam impinges on the beam current detector. The maximum beam current $I_1$ is determined by averaging the beam current readings for the last predetermined beam scan locations in which the entire beam impinges on the beam current detector. From the namely: $I_R = I_0 + R(I_1 - I_0)$, and $I_S = I_0 + S(I_1 - I_0)$, where stored beam current data, two data points are chosen, one of which is between twenty and forth percent above the base current $I_0$ (i.e., R is between 0.2 and 0.4), the other of which is twenty to forty percent below the maximum beam current $I_1$ (i.e., S is between 0.6 and 0.8). A linear regression is performed on the data points between the two located points to establish a straight line function of the general form $I = G(Z - Z_A) + I_0$, where G is the slope of the straight line function, I is the beam current at any scan location Z, and $Z_A$ is the value of Z for I equal to $I_0$. The beam positions $Z_A$, for $I = I_0$, and $Z_B$, for $I = I_1$, are determined. The difference between $Z_B$ and $Z_A$ is a measure of the spotsize in the scan direction.

In order to determine the edgewidths of the spot in the target plane, N beam current data points are noted at N scan locations before and after the beam position $Z_A$. An interpolation between these N data points results in a determination of the beam current at the beam position $Z_A$. A similar interpolation is performed at plural data points around the beam position $Z_B$ to determine the beam current at the beam position. The resulting beam currents, namely $I_A$ and $I_B$ are used to compute the respective edgewidths with the following formulae: $D_A = 4\sqrt{\pi} \, (Z_B - Z_A)(I_A - I_0)/(I_1 - I_0)$ and $D_B = 4\sqrt{\pi}(Z_B - Z_A)(I_1 - I_B)/(I_1 - I_0)$. The values of $D_A$ and $D_B$ obtained with these formulae correspond to the edgewidths between the twelve percent and eighty-eight percent beam current amplitude points.

The above, using R between 0.30 and 0.35, and S between 0.65 and 0.70, resulted in spotsize measurements repeatable within 0.2 percent and edgewidth measurements repeatable within two percent. Of course, the time allotted for data sampling (i.e., bandwidth selection) should be chosen to assure a satisfactory signal-to-noise ratio, preferably better than 60 dB.

In the second method, the data scan is conducted in a direction along the spot diagonal (i.e., in a forty-five degree direction) but perpendicular to the sharp edge. Beam positions $Z_C$ and $Z_D$ are noted where the beam currents are $I_C = I_0 + 19(I_1 - I_0)/64$ and $I_D = I_0 + 45(I_1 - I_0)/64$, respectively. These beam positions are determined by interpolation in the same manner described above. The spotsize can then be computed in accordance with the formula $3.01816(Z_C - Z_D)$. Using this method, the spotsizes obtained differed by less than 1.5 percent from a perfect square to a circle of the same nominal spotsize when the signal-to-noise ratio was equal to or better than 60 dB. This second method is useful for symmetrical spots extending from a perfect square to a circle. The first method yields spotsize and edgewidths for rectangular spots but is sensitive to rounded corners. The second method yields the spotsize of symmetric spots extending from perfect squares to circles, regardless of the corner radius. The differences in the results obtained with both methods for symmetrical spots can be utilized to estimate the corner radius.

BRIEF DESCRIPTION OF THE DRAWINGS

These and other objects, and many of the attendant advantages of the present invention will be appreciated more readily as these become better understood from a reading of the following detailed description, when considered in connection with the accompanying drawings, wherein like parts in each of the several figures are identified by the same reference numerals and wherein.

DESCRIPTION OF THE PREFERRED EMBODIMENTS

Figure 1:
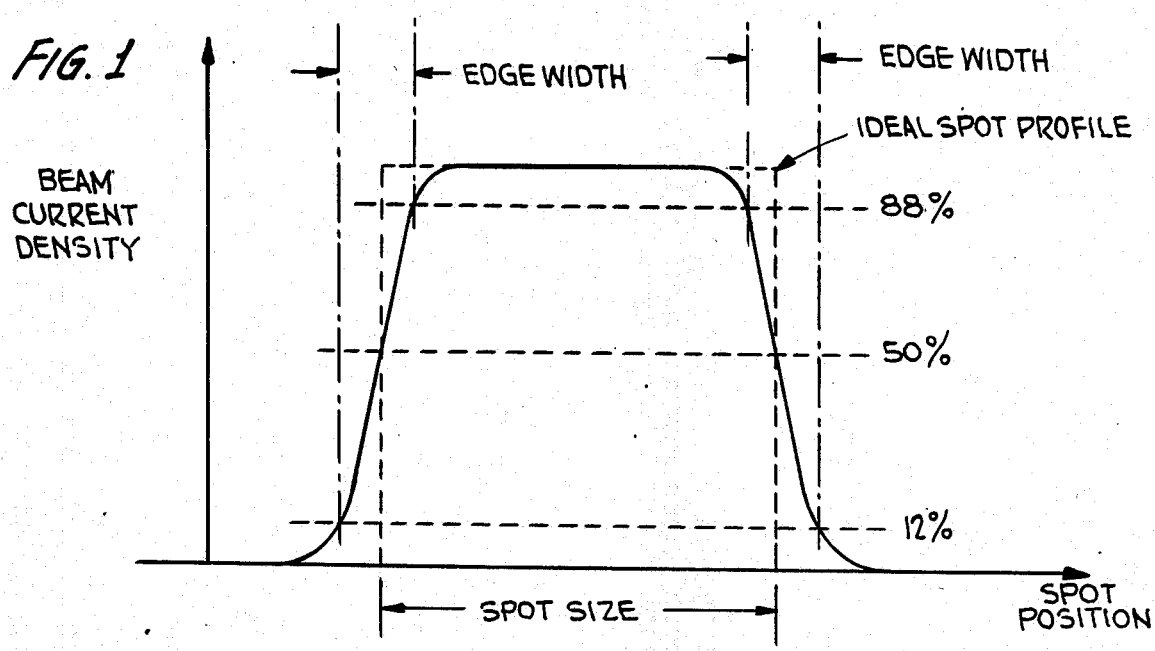
FIG. 1 is a plot of beam current density versus spot position from an electron beam spot with the spot size and edgewidths dimensionally represented.

The beam current density versus beam spot width plot illustrated in FIG. 1 illustrates the spot dimensions by which spot size and edgewidth are defined. The plot represents the beam spot width dimension in the direction of beam scan and indicates the spot size as being defined by the points at which the beam current is fifty percent of maximum. In other words, the beam spot size is the distance between the leading and trailing edges of the spot at the fifty percent amplitude points. This definition is used herein for spot size and is generally accepted in the field.

The edgewidth at both the leading and trailing edges of the spot for purposes of the present invention is defined as the distance in the scan direction between the points having beam current values at twelve and eighty-eight percent of maximum beam current. This corresponds to the standard definition used in connection with Gaussian bell-shaped aberration discs. Other points, such as the ten percent and ninety percent amplitude points, may be employed, if desired, since the general approach of the present invention is applicable to whatever points are meaningful for a particular analysis.

The measurement of spot size and edgewidth by scanning a beam spot across a sharp edge in a target plane is known in the prior art. The beam current signal, provided by a beam current detector as a function of beam deflection and passage of the beam beyond the sharp edge, is conventionally differentiated to yield a spot profile permitting graphical determination of spot size and edgewidth on an oscilloscope screen. As noted above, differentiation results in high pass filtering of the signal, thereby severely reducing the signal-to-noise ratio. The present invention avoids this problem by processing the beam current signal itself, without differentiation.

The method of the present invention is described in the following paragraphs. The particular sequence of the described steps is not critical other than in those instances where measured data or calculated parameters must be available from prior steps.

The invention is performed with a scanning electron beam apparatus, such as:

scanning electron microscopes as illustrated and described in U.S. Pat. Nos. 3,984,678 (Uchiyama Et al) and 4,086,49 (Vaughan); scanning electron beam columns employed to fabricate integrated semiconductor circuits as illustrated and described in U.S. Pat. Nos. 4,142,132 (Harte), 4,390,789 (Smith et al), and 4,243,866 (Pfeiffer et al); and other systems employing scanning electron beams.

The details of the method and apparatus for generating, shaping, focusing and deflecting such beams are very well known in the art and require no significant discussion herein, it being understood that reference may be had to the aforementioned Patents, and to the Patents cited therein, for such details. For present purposes, and with reference to FIG. 3, it is sufficient to understand that a beam current detector 10 is positioned to receive a selectively deflectable (i.e., scanned) electron beam with a beam intercepting member 11 disposed over a portion of the detector 10 in the beam target plane. The beam intercepting member has a straight sharp edge 12 oriented perpendicular to the direction of beam scan. It is important that the beam intercepting member 11 be positioned such that, during the beam scan; (1) there are plural beam positions 13 at the initial portion of the scan wherein the beam spot impinges entirely on the member 11 and no portion of the beam is directly received by detector 10; (2) there are plural beam positions 14 at the end of the scan wherein the beam fully impinges on the detector 10 and does not impinge on the member 11; and (3) there are plural intermediate beam positions 15 wherein the beam impinges partially on the detector 10 and partially on member 11 as the spot scans across sharp edge 12. As the beam is moved or scanned the beam current density signal I, provided by detector 10, increases in the manner illustrated by the curve labelled "data plot" in FIG. 2 from a quiescent or baseline value $I_0$, resulting from beam positions 13, to a maximum current $I_1$, resulting from beam positions 14. The intermediate beam positions 15 result in the varying portions of the data plot wherein the detected beam current increases at an increasing rate with beam displacement, then increases at a constant rate, and finally increases at a decreasing rate as the maximum beam current density $I_1$ is approached. Beam scan, storage of data, computations and signal processing described herein are controlled by a computer in the manner described in detail in relation to FIG. 5.

Figure 2:
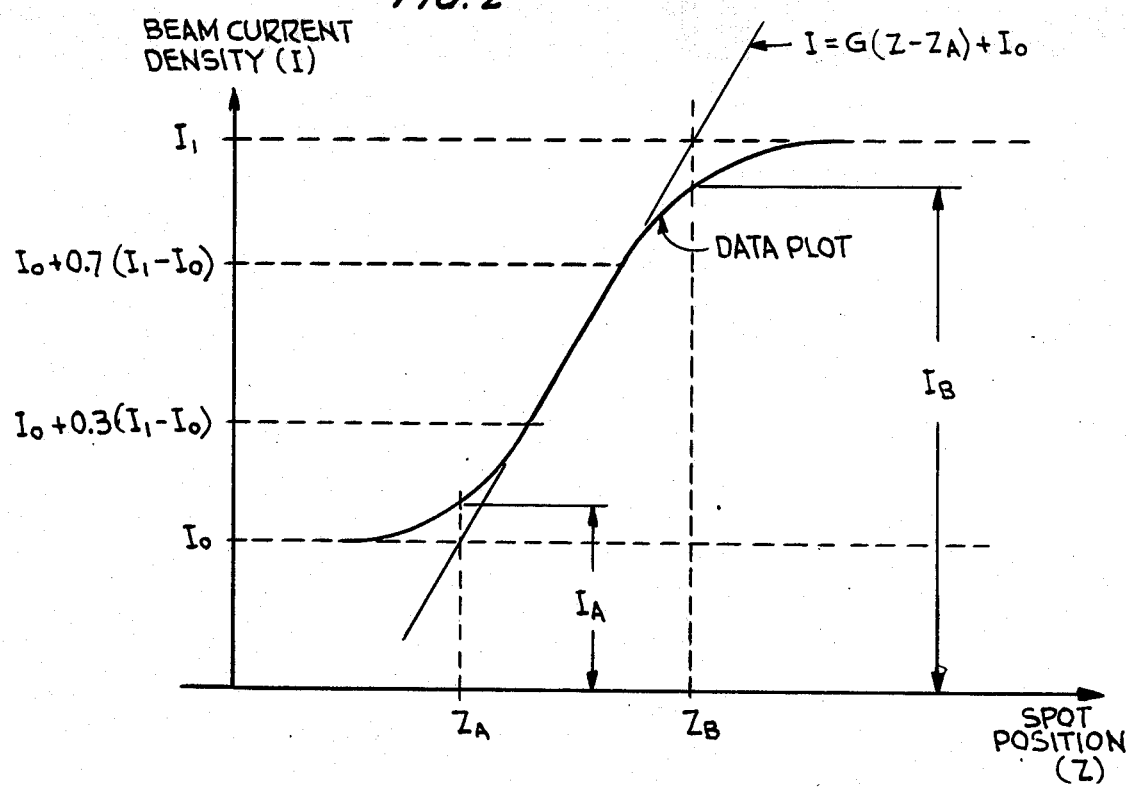
FIG. 2 is a plot of beam current density versus beam position showing an interpolated data plot taken from an incremental beam scan, a linear approximation of the plot obtained from the data and various points and parameters employed to calculate beam edgewidth and spot size in accordance with the present invention.
Figure 3:
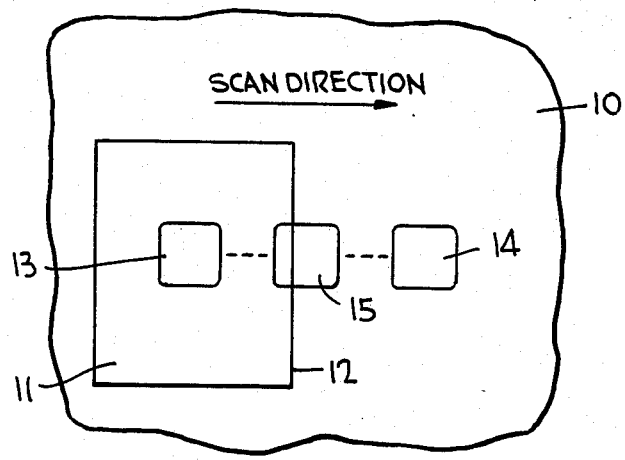
FIG. 3 is a diagrammatic view in plan of a beam current detector and sharp-edged beam intercepting member showing different incremental beam spot positions in the beam target plane during a beam scan.

The method of the present invention requires an initial determination of the baseline current $I_0$ and the maximum current $I_1$. The baseline current $I_0$, as illustrated in FIG. 2, is not necessarily zero. This is because the output signal from beam current detector 10 has a finite amplitude when the beam does not impinge on the detector. The finite amplitude $I_0$ can result from backscattered electrons impinging indirectly on the detector, from inherent biases within the detector, or from spurious signals within the overall system. To determine $I_0$ the beam is deflected to one or more positions 13 in which the beam does not impinge directly on detector 10, and the beam current readings from detector 10 at each such position is stored. It is preferred that the beam current data be taken at approximately ten positions 13 and then averaged to obtain the value of $I_0$. The value of the maximum beam current $I_1$ is determined in a similar manner from beam current readings at one or more beam positions 14, preferrably with the beam spot located at least two spot widths past edge 12. The determined values of $I_0$ and $I_1$ are then stored for use in subsequent processing. It is important to note that the positioning of the beam to determine $I_0$ and $I_1$ may be effected separately and apart from the data scan described below or as part of that data scan. Naturally, a single data scan to obtain all data would be the preferred and most expedient course.

The data scan is effected by incrementally deflecting the electron beam to discreet scan locations and storing the detected beam current registered at each scan location. The incremental or digitized scan requires that there be a distinction drawn between the terms "beam position" and "scan location" for purposes of the present description. The term "scan location" refers to those discrete positions of the beam at which the scan stops during the incremental beam scan. The term "beam position" refers to any deflection position of the beam, whether or not that position corresponds to a scan location. In this regard, it is required, as part of the method described herein, to determine certain beam positions at which the beam current has a calculated or known value, which beam positions may not necessarily correspond to discrete scan locations. Likewise, calculations may yield beam positions at which the beam current must be determined, even though such beam positions do not correspond to discrete scan locations. Under such circumstances the method of the present invention utilizes interpolation techniques between data points taken at scan locations in order to determine the beam current for beam positions located between the data points It is to be noted from FIG. 2 that the data plot for the usual beam spot includes an intermediate portion of substantially constant slope (i.e., a constant rate of change of beam current I versus beam position Z). As part of the present invention an expression is derived for a straight line having the same slope and lying coincident with this intermediate portion of the data plot. This expression is $I = G(Z - Z_A) + I_0$ (where G is the slope of the line and $Z_A$ is the value of Z for $I = I_0$) and is so designated for the straight line illustrated in FIG. 2. In order to establish this expression the system finds points, namely $I_R = I_0 + R(I_1 - I_0)$ and $I_S = I_0 + S(I_1 - I_0)$ at the lower and upper ends, respectively of the linear portion of the data plot. Empirically, it has been found that the straight line portion of the data for a typical beam spot extends from a point twenty to forty percent greater than $I_0$ (i.e., R is between 0.2 and 0.4) to a point twenty to forty percent below $I_1$ (i.e., S is between 0.6 and 0.8). Two such points are designated in FIG. 2, namely $I_0 + 0.3(I_1 - I_0)$, and $I_0 + 0.7(I_1 - I_0)$. The greatest accuracy has been found to exist when these points are chosen to lie in the ranges of thirty to thirty-five and sixty-five to seventy percent. Whatever percentage values are chosen, the system performs a linear regression on the data points having current values between the selected points so as to establish the expression $I = G(Z - Z_A) + I_0$ described above. Typically, there are approximately fifty data points in the linear range of the data plot from which the linear regression is performed.

From the derived linear expression the system can now derive the intersections between the corresponding straight line and the current levels $I_0$ and $I_1$ by means of extrapolation. The beam position at the intersection with the base line current $I_0$ is designated $Z_A$ in FIG. 2; the intersection with the maximum current $I_1$ is designated $Z_B$. The beam currents at beam positions $Z_A$ and $Z_B$ are designated $I_A$ and $I_B$ respectively. The spot size in the scan direction is determined as the difference between $Z_B$ and $Z_A$ which very closely approximates the spot width between the fifty percent beam current amplitude points in the scan direction.

In order to determine edgewidth for the spot in accordance with the present invention it is necessary to determine the beam currents $I_A$ and $I_B$ for beam positions $Z_A$ and $Z_B$. It is only by coincidence that beam positions $Z_A$ and/or $Z_B$ would correspond precisely to scan locations; therefore, it is necessary to interpolate between data points at scan locations above and below $Z_A$ or $Z_B$ to determine the corresponding beam currents $I_A$ or $I_B$. The number N of data points used for this purpose determines the accuracy of the interpolation, with the order of interpolation being defined as (N−1). We have found that a third order interpolation provides sufficient accuracy for most purposes, whereby four data points are required. Thus, to determine $I_A$, the system searches for two data points corresponding to the two scan locations immediately before beam positions $Z_A$ and the two data points corresponding to the two scan locations immediately after beam position $Z_A$. Interpolation between these four data points yields the point ($I_A$, $Z_A$) on the data plot curve. A similar third order interpolation is performed to determine point ($I_B$, $Z_B$). The edgewiths $D_A$ and $D_B$ may then be computed using the following expressions: $D_A = 4\sqrt{\pi}(Z_B - Z_A)(I_A - I_0)/(I_1 - I_0)$; and $D_B = 4\sqrt{\pi}(Z_B - Z_A)(I_1 - I_B)/(I_1 - I_0)$. These values of edge width $D_A$ and $D_B$ correspond to the spot width between the twelve and eighty-eight percent points along the leading and trailing edges, respectively of the plot of FIG. 1. These values pertain to the convention employed in the case of the standard Gaussian aberration disc, and experience with many actual shaped spot electron beam columns has shown that this approximation is justified.

Software for controlling a Hewlett Packard HP/85 computer to perform the above-described method has been derived and is presented in source code form in appendix A.

The concept involved in the method described above has been successfully verified using simulation including Gaussian noise and has then been employed in electron beam columns.

It has been found that the time to be alloted for data sampling (i.e., bandwidth selection) should be chosen to assure a signal-to-noise ratio better than 60 dB. Using a value of R between 0.3 and 0.35, and the value for S between 0.65 and 0.7, resulted in spot size measurements repeatable within 0.2 percent and edgewith measurements repeatable within 2.0 percent.

The method described above is particularly effective for measuring spot size in the scan direction and spot edgewidth for circular spots and rectangular spots in which the corners are sharply defined. However, rectangular or square beam spots often have somewhat rounded corners due to imperfect image forming apertures. The size of such spots cannot be measured or accurately computed using the above-described method. To overcome this the modified method described below may be employed to measure spot size in symetrical beam spots shaped as circles or squares, regardless of any corner radius of curvature in the square shape.

Figure 4:
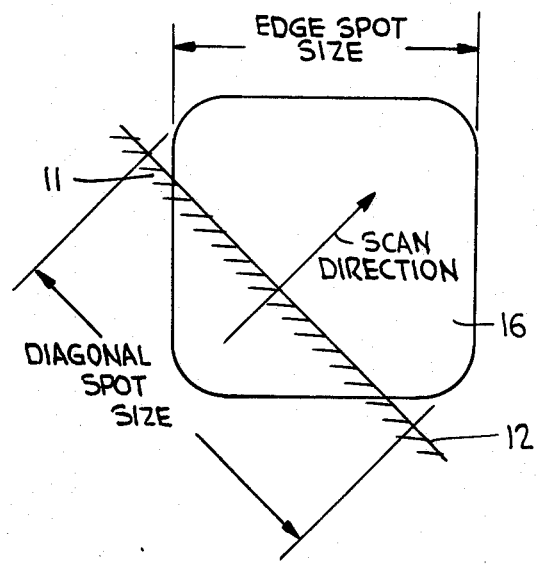
FIG. 4 is a diagrammatic illustration of a beam spot and sharp-edged member showing the scan in the diagonal direction of the spot.

In accordance with the aforesaid modified method of the present invention, and referring to FIG. 4 of the accompanying drawings, a beam spot 16 of square configuration with rounded corners is scanned along its diagonal dimension with that dimension oriented perpendicular to the sharp edge 12 of a beam intercepting member 11. In other words, the beam is rotated by forty-five degrees from its position in the method described above in relation to FIGS. 2 and 3. The modified method is initially similar to that described in relation to FIGS. 2 and 3 in that values for $I_0$ and $I_1$ are initially determined. An incremental scan is effected to yield data points (I,Z) at each incremental scan location. These data points are stored for use during subsequent processing and computation. In order to measure the spot size, it is necessary to determine the beam positions $Z_C$ and $Z_D$ at which the beam current I is, respectively, $I_C = I_0 + 19(I_1 - I_0)/64$, and $I_D = I_0 + 45(I_1 - I_0)/64$. Since $Z_C$ and $Z_D$ do not necessarily correspond to beam scan locations, these beam positions are determined by interpolation in a manner similar to that used to determine $I_A$ and $I_B$ in the method first described hereinabove. More particularly, if a third order interpolation is performed to find $Z_C$, the four data points having beam currents closest to the computed value of $I_C$ are employed. Two of these four data points are those with beam currents immediately below $I_C$; the other two points have beam currents immediately above $I_C$. The interpolation procedure then permits a determination of the beam position $Z_C$ at which the beam current is equal to $I_C$ on the data plot. $Z_D$ is determined in a similar manner.

Once beam positions $Z_C$ and $Z_D$ are determined, the spot size is computed from the value of $3.01816(Z_C - Z_D)$. Of course, the factor 3.01816 need not be carried to five decimal places if a lesser degree of spot size measurement accuracy is permitted.

Computer simulation as well as application of the above-described approximation method to actual measurement in a computer controlled electron-beam column has shown that the obtained spot sizes differ by less than 1.5 percent from a perfect square to a circle of the same nominal spot size when the signal-to-noise ratio is equal to or better than 60 dB.

The two methods described herein may be used in conjunction with one another to measure spot size and edgewidth. For example, the first method may be used to measure edgewidth and the second to measure spot size. Alternatively, the first method may be used to obtain both edgewidth and spot size; the second method may then be used to measure the side of a square beam or to confirm constant roundness of a circular beam.

Figure 5:
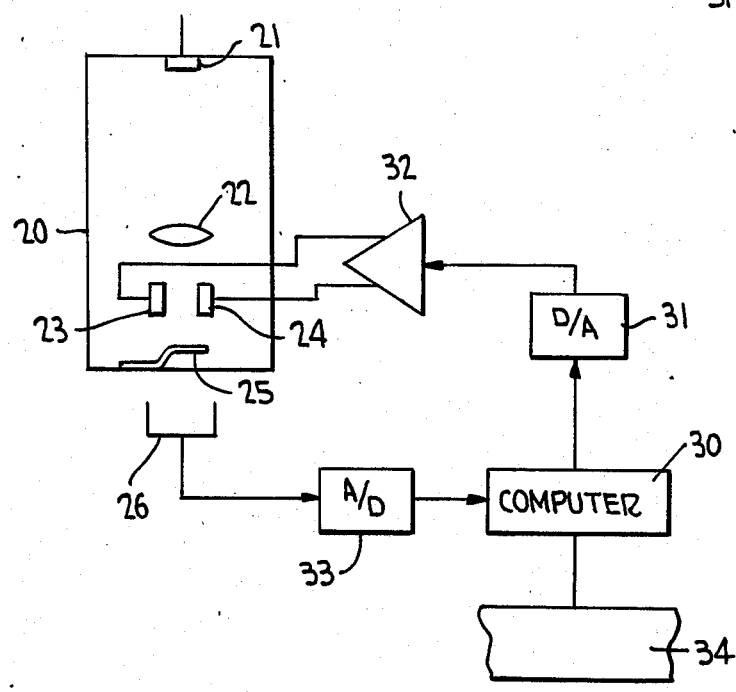
FIG. 5 is a functional block diagram of apparatus for performing the method of the present invention.

Apparatus for performing the method described herein is illustrated scematically in FIG. 5. An electron beam system 20 includes and electron emiter 21, beam focussing means 22, beam deflection plate 23, 24, a sharp-edged beam intercepting plate 25 in the beam target plane, and a beam current detector 26. These elements are all standard and conventional elements employed in scanning electron beam systems. A computer 30 controls the voltage applied to the deflection plates 23, 24 in order to effect the required digitized or incremental scan. Deflection plates 23, 24 are controlled via a digital-to-analog converter 31 which receives timed controlled signals from the computer 30 and provides corresponding discrete amplitude levels to the deflection plates via differential driver amplifier 32. Beam current signals from the detector 26 are converted to digital levels by analog-to-digital converter 33 and are stored in conjunction with corresponding scan locations as data points in computer 30. An appropriate readout of the spot size and edgewidth parameters computed in computer 30 is provided at element 34 which may be a cathode ray tube display, printer, or the like.

In an actual embodiment of the present invention, successfully operated and tested, computer 30 was a Hewlett Packard HP-85 computer. The computer was controlled by software for which the source code in BASIC language is set forth in appendix A.

Having described several embodiments of a method and apparatus for measuring spot size and edgewidth in electron beam lithography systems in accordance with the present invention, it is believed obvious that other modifications and variations of the invention will be suggested to those skilled in the art in light of the description set forth above. It is therefore to be understood that changes may be made in the particular embodiments of the invention described which are within the full intended scope of the invention defined by the appended claims.

APPENDIX A

PROGRAM IN "BASIC" WRITTEN FOR HP-85 COMPUTER

```
 5 OPTION BASE 1
10 ! "READ9"
20 ! THIS PROGRAM READS DATA FROM THE HP5423A AND
   CALCULATES SPOT PROFILE EDGE WIDTHS
30 DIM X(512,2),A(5)
35 DIM M(5)
```

APPENDIX A-continued
PROGRAM IN "BASIC" WRITTEN FOR HP-85 COMPUTER

```
40  OUTPUT 704 ;" ,0,1,PRPR ! PRINTS DATA ONLY IN ASCII
    TO HP85
45  S=SPOLL(704) ! SERIAL POLL THE ANALYZER
50  STATUS 7,1 ; B ! CLEARS REGISTER1 IN HP-IB INTERFACE.
    B IS A DUMMY VARIABLE
60  IF S<>100 THEN 45 ! IF S IS NOT EQUAL TO 100, GO TO START
    OF CURRENT LINE
61  ! WAIT FOR THIS PRINT TO START
69  BEEP
70  ENTER 704 ; N0 ! READ THE NO., N OF DATA POINTS TO BE
    PRINTED(N/2 DATA PAIRS)
72  N0=N0/2
73  DISP "NO. OF DATA PAIRS=";N0
74  DISP "DATA TRANSFER IN PROGRESS"
75  FOR I=1 TO N0
76  FOR J=1 TO 2
77  ENTER &04 ; X(I,J)
78  NEXT J
79  NEXT I
80  ! CHECK FOR POSITIVE SLOPE
82  IF X(1,2)<X(N0,2) THEN 99
84  DISP "NEGATIVE SLOPE, INVERT TRACE"
86  DISP "TRAILING EDGE IS NOW LEADING EDGE, AND VICE VERSA."
88  FOR I=1 TO N0/2
92  L-N0-I+1
93  T=X(I,2)
94  X(L,2)=X(I,2)
95  X(I,2)=T
96  NEXT I
99  DISP "EDGE WIDTH COMPUTE IN PROGRESS."
100 ! AVERAGE THE 10 LAST DATA POINTS TO DETERMINE THE VALUE,
    T,OF THE TOP PLATEAU
110 N9=N0-9
120 T1=0
130 FOR I=N9 TO N0
140 T1=T1+X(I,2)
150 NEXT I
160 T=T1/10 ! VALUE OF TOP PLATE AU
170 ! AVERAGE THE 10 FIRST DATA POINTS TO DETERMINE THE VALUE
    L,OF THE BOTTOM PLATEAU
180 L1=0
190 FOR I=1 TO 10
200 L1=L1+X(I,2)
210 NEXT I
220 L=L1/10 ! VALUE OF BOTTOM PLATEAU
250 S=T-L ! 100% SIGNAL LEVEL
260 S7=.7*S+L ! 70% SIGNAL LEVEL
270 S3=.3*S+L ! 30% SIGNAL LEVEL
280 ! DETERMINE THE INDEX,I, OF THE DATA PAIR CORRESPONDING
    TO THE 70% SIGNAL LEVEL
290 FOR I=N0-9 TO 10 STEP -1
300 IF X(I,2)<S7 THEN 330
310 NEXT I
330 17=I ! INDEX NO. OF 70% PT 340 DISP "70% INDEX NO.=";17
350 ! DETERMINE THE INDEX NO.,I3, OF THE DATA PAIR
    CORRESPONDING TO THE 30% SIGNAL LEVEL
360 FOR I=10 TO N0-9
370 IF X(I,2)>S3 THEN 400
380 NEXT I
400 I3=1 ! INDEX NO. OF 30% PT
420 N=17-13+1
430 ! LINEAR REGRESSION ROUTINE YIELDS SLOPE,M;INTERCEPT,B;
    AND R-SQUARE,R2
440 A(1),A(2),A(3),A(4),A(5)=0
450 FOR I1=13 TO 17
460 A(1)=A(1)+X(I1,1) @ A(2)=A(2)+X(I1,1)*X(I1,1) @ A(3)=A(3)+X(I1,2)
470 A(4)=A(4)+X(I1,2)*X(I1,2) @ A(5)=A(5)+X(I1,1)*X(I1,2)
480 NEXT I1
490 M(1)=A(1)/N @ M(2)=(A(2)-A(1)*A(1)/N/(N-1) @ M(3)=A(3)/N
500 M(4)=A(4)-A(3)*A(3)/N)/(N-1) @ M(5)=(A(5)-A(1)*A(3)/N)/
    (A(2)-A(1)*A(1)/N)
510 R5=M(3)-M(1)*M(5) ! INTERCEPT
520 S=M(5) (A(5)-A(1)*A(3)/N)
530 R2=S/(A(4)-A(3)*A(3) ?N) ! R-SQUARE
540 M=M(5) ! SLOPE
550 B=R5 ! INTERCEPT
590 ! CALCULATE THE LEADING AND TRAILING EDGE-WIDTHS OF
600 ! THE SPOT PROFILE USING THE LINEAR REGRESSION DATA
610 Z=2.5 ! NOMINAL SPOT-SIZE IN MICRONS
620 X1=(L-B)/M ! THE X COORD. CORRESPONDING TO THE BASE PLATEAU
    VALUE, L
```

APPENDIX A-continued

PROGRAM IN "BASIC" WRITTEN FOR HP-85 COMPUTER

```
630 X2=(t-B)/M ! THE X COORD. CORRESPONDING TO THE TOP PLATEAU
    VALUE, T
640 ! TO OBTAIN Y1 AND Y2, THE INTERCEPTS CORRESP. TO
650 ! X1 AND X2, INTERPOLATE FROM THE DATA FILE
660 X=X1
670 GOSUB 2000
680 Y1=Y3 ! Y1 INTERCEPT
690 X=X2
700 GOSUB 2000
710 Y2=Y3 ! Y2 INTERCEPT
755 ! CALCULATE THE LEADING EDGE WIDTH,E1
770 I1=Y1-L
780 E1=4*SQR(PI)*I1*Z/(T-L)
792 DISP USING 793 ; E1
793 IMAGE "LEADING EDGE-WIDTH =",D.DD, "MICRON."
800 ! CALCULATE THE TRAILING EDGE-WIDTH,E2
810 I2=T-Y2
820 E2=4*SQR(PI)*I2*Z/(T-L)
830 DISP USING 832 ; E2
832 IMAGE "TRAILING EDGE-WIDTH=",D.DD," MICRON."
840 GOTO 2200
2000 ! THIS SUBROUTINE DETERMINES THE Y COORD.
2010 ! CORRESP. TO A GIVEN X COORD. IN THE DATA FILE
2020 FOR Q=1 TO N0
2030 IF X(Q,1)>X THEN 2060
2040 NEXT Q
2050 DISP "INTERPOLATION FAILED"
2060 X9=X(Q,1) ! NEXT HIGHEST X VALUE
2070 X0=X(Q-1,1) ! NEXT LOWEST X VALUE
2080 Y9=X(Q,2) ! Y COORD. CORRESPONDS TO X 9
2090 Y0=X(Q-1,2) ! Y COORD. CORRESPONDS TO X0
2100 Y3-(Y9-Y0)*(X-X0)/(X9-X0)+Y 0 ! Y CORRESPONDS TO X
2110 RETURN
2200 END
```

What is claimed is:

1. A method of determining a predetermined transverse dimension of a selectively deflectable electron beam at a target plane using a beam current detector positioned downstream of the target plane to directly receive none, some or all of the beam as a function of beam deflection, said method comprising the steps of:
   (a) determining and storing a baseline beam current value, $I_0$, indicated by said beam current detector when said beam is deflected so that no portion of the beam impinges upon said beam current detector;
   (b) determining and storing a maximum beam current value, $I_1$, indicated by said beam current detector when said beam is deflected such that the entire beam impinges upon said beam current detector;
   (c) positioning a beam intercepting member having a straight sharp edge in said target plane to partially block said beam current detector so as to pass none, some or all of said beam to said beam current detector as a function of beam deflection position, said sharp edge being longer than said predetermined transverse dimension and overlying said beam current detector;
   (d) scanning said beam across said sharp edge and said beam current detector along a linear path extending perpendicular to said sharp edge, said scanning being in predetermined increments between discrete scan locations;
   (e) measuring the beam current with said beam current detector at each scan location and storing the measured beam current for each such scan location;
   (f) searching the stored beam currents to determine the beam scan location $Z_R$ at which the beam current value $I_R=I_0+R(I_1-I_0)$, where R is a constant having a value in the range from approximately 0.20 to 0.40;
   (g) searching the stored beam currents at said scan locations to determine the beam scan location $Z_S$ at which the beam current $I_S=I_0+S(I_1-I_0)$, where S is a constant having a value in the range from approximately 0.60 to 0.80;
   (h) performing a linear regression for the stored beam currents at scan locations between $Z_R$ and $Z_S$ to provide an equation representing a straight line function for the beam current I in terms of beam position Z in the form of $I=G(Z-Z_A)+I_0$, where G is the slope of said straight line function and $Z_A$ is the value of Z when I is equal to $I_0$;
   (i) computing from said equation the value of $Z_B$ for I equal to $I_1$; and
   (j) subtracting $Z_A$ from $Z_B$ to provide a measure of said predetermined transverse dimension of said beam in the direction of beam scan in step (d).

2. The method according to claim 1 wherein step (f) includes establishing in the equation for $I_R$ a value for R in the range between 0.25 and 0.35, and wherein step (g) includes establishing in the equation for $I_S$ a value for S in the range between 0.65 and 0.75.

3. The method according to claim 1 wherein step (a) includes:
   deflecting said beam to a plurality of non-impinging scan locations in which no portion of the beam impinges on the beam current detector;
   measuring and storing the beam current detected by said beam current detector for each of said non-impinging scan locations of the beam; and
   computing the average of the measured and stored beam currents for said non-impinging scan locations to establish the base line beam current $I_0$.

4. The method according to claim 1 wherein step (b) includes:

deflecting said beam to a plurality of fully impinging scan locations in which the entire beam impinges upon said beam current detector;

measuring and storing the beam current detected by said beam current detector for each of said fully impinging scan locations of the beam; and computing the average of the measured and stored beam currents for said fully impinging scan locations to establish the maximum beam current $I_1$.

5. The method according to claim 1 further comprising determining the edgewidths of said beam in the scanning direction by the steps of:

(k) locating plural scan locations immediately before and after beam position $Z_A$;

(l) determining, from the measured beam currents stored in step (c), the measured beam currents at each of the scan locations located in step (k);

(m) interpolating from the beam currents determined in step (l), the beam current $I_A$ for the beam position $Z_A$;

(n) locating plural scan locations immediately before and immediately after beam position $Z_B$;

(o) determining from the measured beam currents stored in step (c), the measured beam currents at each of the scan locations located in step (n);

(p) interpolating, from the beam currents determined in step (o), the beam current $I_B$ for beam position B; and (q) computing the edgewidths $D_A$ and $D_B$ of the beam in the scan direction from the equations $D_A = C(Z_B - Z_A)(I_A - I_0)/(I_1 - I_0)$ and $D_B = C(Z_B - Z_A)(I_1 - I_B)/(I_1 - I_0)$, where C is a constant.

6. The method according to claim 5 wherein step (q) includes establishing a value of $4\sqrt{\pi}$ for the constant C.

7. The method according to claim 5 wherein step (k) includes locating N/2 scan locations immediately before beam position $Z_A$ and N/2 scan locations immediately after beam position $Z_A$; wherein step (n) includes locating N/2 scan locations immediately before beam position $Z_B$ and N/2 scan locations immediately after beam position $Z_B$; and wherein N is an integer corresponding to one or more than the order of interpolation in steps (m) and (p).

8. The method according to claim 7 wherein steps (k) and (n) include establishing a value of four for the integer N.

9. The method according to claim 1 further comprising determining the width of an edge of the beam in the scanning direction by the steps of:

(k) locating plural scan locations immediately before and after beam position $Z_A$;

(l) determining, from the measured beam currents stored in step (c), the measured beam currents at each of the scan locations located in step (k);

(m) interpolating, from the beam currents determined in step (l), the beam current $I_A$ for the beam position $Z_A$; and computing the edgewidth $D_A$ of the beam in the scan direction from the equation $D_A = C(Z_B - Z_A)(I_A - I_0)/(I_1 - I_0)$, where C is a constant.

10. The method according to claim 9 wherein step (q) includes establishing a value of $4\sqrt{\pi}$ for the constant C.

11. The method according to claim 9 wherein step (k) includes locating N/2 scan locations immediately before beam position $Z_A$ and N/2 scan locations immediately after beam position $Z_A$; and wherein N is an integer corresponding to one or more than the order of interpolation in step (m).

12. The method according to claim 1 further comprising determining the width of an edge of the beam in the scanning direction by the steps of:

(n) locating plural scan locations immediately before and immediately after beam position $Z_B$;

(o) determining, from the measured beam currents stored in step (c), the measured beam currents at each of the scan locations located in step (n);

(p) interpolating, from the beam currents determined in step (o) the beam $I_B$ current for beam position $Z_B$; and computing the edgewidth $D_B$ of the beam in the scan direction from the equation $D_B = C(Z_B - Z_A)(I_1 - I_B)/(I_1 - I_0)$, where C is a constant.

13. The method according to claim 12 wherein step (q) includes establishing a value of $4\sqrt{\pi}$ for the constant C.

14. The method according to claim 12 wherein step (n) includes locating N/2 scan locations immediately before beam position $Z_B$ and N/2 scan locations immediately after beam position $Z_B$; and wherein N is an integer corresponding to one or more than the order of interpolation in step (p).

15. The method according to claim 5 wherein said beam has a cross-section in the target plane which is substantially square with rounded corners, said linear path being substantially perpendicular to two opposite sides of said cross-section, and $(Z_B - Z_A)$ represents the distance between said opposite sides, said method further comprising determining a side of the square of said cross-section by the steps:

(r) scanning said beam across said sharp edge and said beam current detector such that said diagonal dimension of the beam passes perpendicular to said sharp edge, the scanning being in said predetermined increments between said discrete scan locations;

(s) measuring the beam current with said beam current detector at each scan location in step (r) and storing the measured beam current I for each scan location of step (r);

(t) from the beam currents stored in step (s), determining the beam position $Z_C$ at which the beam current $I = I_0 + 19(I_1 - I_0)/64$ and the beam position $Z_D$ at which the beam current $I = I_0 + 45(I_1 - I_0)/64$; and (u) computing $W(Z_C - Z_D)$ to provide a measure of said side of said square, where W is a constant approximately equal to three.

16. The method according to claim 15 wherein W is equal to 3.01816.

17. The method according to claim 1 wherein said beam has a cross-section in the target plane which is substantially square with rounded corners, said linear path being substantially perpendicular to two opposite sides of said cross-section, and $(Z_B - Z_A)$ represents the distance between said opposite sides, said method further comprising determining the a side of the square of said cross-section by the steps:

(r) scanning said beam across said sharp edge and said beam current detector such that a diagonal dimension of the beam passes perpendicular to said sharp edge, the scanning being in said predetermined increments between said discrete scan locations;

(s) measuring the beam current with said beam current detector at each scan location in step (r) and storing the measured beam current I for each scan location of step (r);

(t) from the beam currents stored in step (s), determining the beam position $Z_C$ at which the stored beam current $I=I_0+19(I_1-I_0)/64$ and the beam position at which the stored beam current $I=I_0+45(I_1-I_0)/64$; and (u) computing $W(Z_C-Z_D)$ to provide a measure of said side of said square, where W is a constant approximately equal to three.

18. Apparatus for determining a predetermined transverse dimension of a selectively deflectable electron beam at a beam target plane, said apparatus comprising:

a beam current detector positioned downstream of said target plane to directly receive none, some or all of the beam as a function of beam deflection;

means for determining and storing a base line beam current value, $I_0$, indicated by said beam current detector when said beam is deflected such that no portion of the beam impinges upon said beam current detector;

means for determining and storing a maximum beam current value, $I_1$, indicated by said beam current detector when said beam is deflected such that the entire transverse periphery of said beam impinges upon said beam current detector;

beam intercepting means having a straight sharp edge disposed in said target plane to partially block said beam current detector so as to pass none, some or all of said beam to said beam current detector as a function of beam position, said sharp edge being longer than said predetermined transverse dimension and overlying said beam current detector;

means for scanning said beam across said sharp edge and said beam current detector in a linear path perpendicular to said sharp edge in predetermined increments between discrete scan locations;

means for storing beam current measured by said beam current detector for each beam scan location;

means for searching the stored beam currents at said scan locations to determine the beam position $Z_R$ at which the beam current value $I_R=I_0+R(I_1-I_0)$, where R is a constant having a value in the range from approximately 0.20 to 0.40;

means for searching the stored beam currents of said scan locations to determine the beam position $Z_S$ at which the beam current $I_S=I_0+S(I_1-I_0)$, where S is a constant having a value in the range from approximately 0.60 to 0.80;

means for performing a linear regression for the stored beam currents at scan locations between $Z_R$ and $Z_S$ to provide an equation representing a straight line function for the beam current I in terms of beam position Z in the form $I=G(Z-Z_A)+I_0$, where G is the slope of said straight line function and $Z_A$ is the value of Z for I equal to $I_0$;

means for computing from said equation the value of $Z_B$ for I equal to $I_1$ and means for subtracting $Z_A$ from $Z_B$ to provide a measure of the predetermined transverse dimension of said beam in the direction of beam scan.

19. The apparatus according to claim 18 wherein said means for determining $I_0$ comprises:

means for deflecting said beam to a plurality of non-impinging scan locations at which no portion of the beam impinges upon said beam current detector;

means for storing the beam current detected by said beam current detector at each of said non-impinging scan locations of the beam; and means for computing the average of the measured and stored beam currents for said non-impinging scan locations to establish the base line beam current $I_0$.

20. The apparatus according to claim 18 wherein said means for determining $I_1$ includes:

means for deflecting said beam to a plurality of fully impinging scan locations in which the entire beam impinges upon said beam current detector;

means for storing the beam current detected by said beam current detector for each of said fully impinging scan locations of the beam; and means for computing the average of the measured and stored beam currents at said fully impinging scan locations to establish the maximum beam current $I_1$.

21. The apparatus according to claim 18 further comprising means for determining the edgewidths of said beam in the scanning direction comprising:

means for locating N scan locations immediately before and after said beam position $Z_A$;

means for determining the N stored beam currents at each of said N locations, respectively;

means for interpolating from said N beam currents the beam current I for beam position $Z_A$; and means for computing the edgewidth $D_A$ of said beam from the equation $D_A=C(Z_B-Z_A)(I_A-I_0)/(I_1-I_0)$, where C is a constant.

22. The apparatus according to claim 21 further comprising:

means for locating N additional scan locations immediately before and immediately after beam position $Z_B$;

means determining, from the stored beam currents, N additional beam currents at each of said N additional scan locations, respectively;

means for interpolating, from said N additional beam currents, the beam current $I_B$ for beam position $Z_A$; and means for computing the edgewidth $D_B$ of the beam from the equation $D_B=C(Z_B-Z_A)(I_1-I_B)/(I_1-I_0)$.

23. The apparatus according to claim 22 wherein C has a value of $4\sqrt{\pi}$.

24. The apparatus according to claim 22 wherein said N scan locations include N/2 scan locations immediately before beam position $Z_A$ and N/2 scan locations immediately after beam position $Z_A$; wherein said N additional scan locations include N/2 scan locations immediately before beam position $Z_B$ and N/2 scan locations immediately after beam position $Z_B$; and wherein N is an integer corresponding to one more than the order of interpolation by said means for interpolating.

25. The apparatus according to claim 18 wherein said beam has a cross-section in said target plane which is substantially square with rounded corners, said linear path being substantially perpendicular to two opposite sides of said cross-section, and wherein $(Z_B-Z_A)$ represents the distance between said opposite sides, said apparatus further comprising means for determining the size of a side of said cross-section comprising:

means for scanning said beam across said sharp edge and said beam current detector such that a diagonal dimension passes perpendicular to said sharp edge, the scanning being in said predetermined increments between discrete diagonal scan locations;

means for measuring the beam current with said beam current detector at each diagonal scan location;

means for storing the measured beam current for each diagonal scan location;

means for determining the beam position $Z_C$ at which the stored beam current is equal to $I_0+19(I_1-I_0)/64$ and the beam position at which the stored beam current is equal to $I_0+45(I_1-I_0)/64$; and means for computing $W(Z_C-Z_D)$ to provide a measure of said side of said cross-section, wherein W is a constant approximately equal to three.

26. The method of determining a predetermined dimension in a target plane of a selectively deflectable electron beam having a cross-section in said target plane which is substantially symmetrical about a certain point, said method employing a beam current detector positioned downstream of the target plane to directly receive none, some or all of the beam as a function of beam deflection, said method comprising the steps of:

(a) determining and storing a base line beam current value, $I_0$, indicated by said beam current detector when said beam is deflected so that no portion of the beam impinges upon said beam current detector;

(b) determining and storing a maximum beam current value, $I_1$, indicated by said beam current detector when said beam is deflected such that the entire beam impinges upon said beam current detector;

(c) positioning a beam intersecting member having a straight sharp edge in said target plane to partially block said beam current deflector so as to pass none, some or all of said beam to said beam current detector as a function of beam deflection location, said sharp edge being longer than said predetermined transverse dimension and overlying said beam current detector;

(d) scanning said beam across said sharp edge and said beam current detector such that said diagonal dimension passes perpendicular to said sharp edge, the scanning being in predetermined increments between discrete scan locations Z;

(e) measuring the beam current with said beam current detector at each scan location in step (d) and storing the measured beam current for each scan location of step (d);

(f) from the beam currents stored in step (e), determining the beam position $Z_C$ at which the stored beam current is equal to $I_0+19(I_1-I_0)/64$ and the beam position $Z_D$ at which the stored beam current is equal to $I_0+45(I_1-I_0)/64$; and (g) computing $W(Z_C-Z_D)$ to provide a measure of said predetermined dimension, where W is a constant approximately equal to three.

27. The method according to claim 26 wherein W is equal to 3.01816.

28. The method according to claim 26 wherein said beam cross-section in said target plane has a square configuration with rounded corners, and wherein said predetermined dimension is a side of said square.

* * * * *